(12) United States Patent
Beltran Lizarraga

(10) Patent No.: US 9,991,857 B2
(45) Date of Patent: Jun. 5, 2018

(54) MATCHING NETWORK FOR BROADBAND POWER AMPLIFIER

(71) Applicant: SKYWORKS SOLUTIONS, INC., Woburn, MA (US)

(72) Inventor: Ramon Antonio Beltran Lizarraga, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days. days.

(21) Appl. No.: 15/135,548

(22) Filed: Apr. 21, 2016

(65) Prior Publication Data

US 2016/0315591 A1 Oct. 27, 2016

Related U.S. Application Data

(60) Provisional application No. 62/151,344, filed on Apr. 22, 2015.

(51) Int. Cl.
| | |
|---|---|
| *H04B 1/04* | (2006.01) |
| *H04B 1/40* | (2015.01) |
| *H03F 3/217* | (2006.01) |
| *H03F 1/56* | (2006.01) |
| *H03F 3/195* | (2006.01) |

(52) U.S. Cl.
CPC .......... *H03F 3/2176* (2013.01); *H03F 1/565* (2013.01); *H03F 3/195* (2013.01); *H03F 2200/391* (2013.01); *H03F 2200/451* (2013.01); *H03F 2200/541* (2013.01); *H04B 2001/0408* (2013.01)

(58) Field of Classification Search
CPC .......... H04B 2001/0408; H04B 1/0458; H04B 7/0465; H04B 1/40; H03F 3/2176; H03F 1/565; H03F 3/195; H03F 2200/391; H03F 2200/541; H03F 2200/451
See application file for complete search history.

(56) References Cited

U.S. PATENT DOCUMENTS

| | | | | |
|---|---|---|---|---|
| 2008/0180178 A1* | 7/2008 | Gao | .......... | H03F 1/565 330/302 |
| 2009/0295473 A1* | 12/2009 | Dupuy | .......... | H03F 1/0222 330/124 R |
| 2011/0279184 A1* | 11/2011 | Chan | .......... | H03F 1/223 330/295 |
| 2011/0298535 A1* | 12/2011 | Van Rijs | .......... | H03F 1/0222 330/53 |
| 2012/0206206 A1* | 8/2012 | Winslow | .......... | H03F 1/565 330/307 |
| 2013/0033325 A1* | 2/2013 | Ladhani | .......... | H03F 1/0288 330/277 |

(Continued)

*Primary Examiner* — Andrew Wendell
(74) *Attorney, Agent, or Firm* — Chang & Hale LLP

(57) ABSTRACT

Matching network for broadband power amplifier. In some embodiments, a power amplifier can include an amplifying transistor having an input and an output, and a matching circuit coupled to the output of the amplifying transistor. The matching circuit can include a first capacitance, an inductance, and a second capacitance connected in series. The matching circuit can further include a third capacitance implemented in a shunt path from a node between the first capacitance and the inductance to a ground, and a fourth capacitance implemented in a shunt path from a node between the inductance and the second capacitance to the ground.

20 Claims, 11 Drawing Sheets

(56) References Cited

U.S. PATENT DOCUMENTS

2013/0127540 A1* 5/2013 Kim ................. H03F 1/3205
                                              330/285
2014/0320205 A1* 10/2014 Lyalin ............... H01F 27/2804
                                              330/185
2016/0105153 A1* 4/2016 Chen ................ H03F 1/565
                                              330/296
2017/0149392 A1* 5/2017 Zhao ................ H03F 1/565

* cited by examiner

MATCHING NETWORK FOR BROADBAND POWER AMPLIFIER

CROSS-REFERENCE TO RELATED APPLICATION(S)

This application claims priority to U.S. Provisional Application No. 62/151,344 filed Apr. 22, 2015, entitled BROADBAND CLASS-E POWER AMPLIFIER DESIGNED BY LUMPED-ELEMENT NETWORK TRANSFORMS AND GaN FETs, the disclosure of which is hereby expressly incorporated by reference herein in its entirety.

BACKGROUND

Field

The present disclosure relates to matching network for power amplifiers.

Description of the Related Art

Many electronic devices such as wireless devices include power amplifiers for amplifying radio-frequency (RF) signals to be transmitted. Such power amplifiers can include matching networks to improve such transmission of RF signals.

SUMMARY

In accordance with some implementations, the present disclosure relates to a power amplifier that includes an amplifying transistor having an input and an output. The power amplifier further includes a matching circuit coupled to the output of the amplifying transistor and having a first capacitance, an inductance, and a second capacitance connected in series. The matching circuit further includes a third capacitance implemented in a shunt path from a node between the first capacitance and the inductance to a ground, and a fourth capacitance implemented in a shunt path from a node between the inductance and the second capacitance to the ground.

In some embodiments, the amplifying transistor can include a gate for receiving a radio-frequency (RF) signal, a source coupled to the ground, and a drain as the output for providing an amplified RF signal. The matching circuit can be configured to provide matching to a load impedance at an output of the matching circuit. In some embodiments, the load impedance can be approximately 50 Ohms.

In some embodiments, the power amplifier can be configured to operate as a broadband class-E power amplifier. Values of the first capacitance, the inductance, the second capacitance, the third capacitance, and the fourth capacitance can be based on a plurality of transforms of a first matching circuit of a broadband class-E power amplifier configured to provide matching to a first load impedance that is lower than 50 Ohms.

In some embodiments, the plurality of transforms can include a first transform in which an L-C matching network is utilized to provide an increased impedance matching from the first load impedance to an second load impedance value that is between the first load impedance value and 50 Ohms.

In some embodiments, the plurality of transforms can further include a second transform in which inductances along a signal path are merged into a single inductance, and a capacitance along the signal path is split into a plurality of capacitances.

In some embodiments, the plurality of transforms can further include a third transform in which an L-left to L-right transform is applied.

In some embodiments, the plurality of transforms can further include a third transform in which an L-right to L-left transform is applied.

In some embodiments, the plurality of transforms can further include a fourth transform in which a transformer is utilized to provide a further increased impedance matching from the second load impedance value to 50 Ohms.

In some embodiments, the plurality of transforms can further include a fifth transform in which a transformer-moving transform is applied to move one or more transformer such that a plurality of transformers are grouped together. In some embodiments, the plurality of transformers can have an overall transform ratio of approximately 1.

In some implementations, the present disclosure relates to a radio-frequency (RF) module that includes a packaging substrate configured to receive a plurality of components, and a power amplifier implemented on the packaging substrate. The power amplifier includes an amplifying transistor having an input and an output, and a matching circuit coupled to the output of the amplifying transistor. The matching circuit includes a first capacitance, an inductance, and a second capacitance connected in series. The matching circuit further includes a third capacitance implemented in a shunt path from a node between the first capacitance and the inductance to a ground, and a fourth capacitance implemented in a shunt path from a node between the inductance and the second capacitance to the ground.

In some embodiments, the RF module can be a power amplifier module. In some embodiments, at least a portion of the power amplifier can be implemented on a semiconductor die. In some embodiments, the semiconductor die can be a silicon-based die or a gallium-based die.

According to some teachings, the present disclosure relates to a wireless device that includes a transceiver, and a power amplifier in communication with the transceiver and configured to amplify a radio-frequency (RF) signal. The power amplifier includes an amplifying transistor having an input and an output. The power amplifier further includes a matching circuit coupled to the output of the amplifying transistor and having a first capacitance, an inductance, and a second capacitance connected in series. The matching circuit further includes a third capacitance implemented in a shunt path from a node between the first capacitance and the inductance to a ground, and a fourth capacitance implemented in a shunt path from a node between the inductance and the second capacitance to the ground. The wireless device further includes an antenna in communication with the power amplifier and configured to facilitate transmission of the amplified RF signal.

In some embodiments, the wireless device can be a cellular phone.

In some implementations, the present disclosure relates to a matching circuit for a power amplifier. The matching circuit includes a signal path implemented between a first node for coupling to an output of the power amplifier and a second node for coupling to a load having a characteristic impedance. The signal path includes a first capacitance, an inductance, and a second capacitance connected in series between the first node and the second node. The matching circuit further includes a third capacitance implemented in a shunt path from a node between the first capacitance and the inductance to a ground, and a fourth capacitance implemented in a shunt path from a node between the inductance and the second capacitance to the ground.

In some embodiments, the power amplifier can include a transistor having a gate for receiving a radio-frequency (RF) signal, a source coupled to the ground, and a drain for outputting an amplified RF signal, such that the second node is coupled to the drain of the transistor. In some embodiments, the characteristic impedance of the load can be approximately 50 Ohms.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In some radio-frequency (RF) applications, broadband operation of class-E amplifiers is possible using a reactance compensation technique. Disclosed herein are various examples where broadband lumped-element network transforms can be utilized in order to design a loading network that provides broadband reactance compensation and broadband impedance matching simultaneously while keeping high efficiency and maintaining output power within a wide bandwidth.

In some embodiments, an output network topology can include alternates of series and shunt components which can be suitable for practical implementation and tuning. Also described herein are performance examples obtained from a gallium nitride (GaN) field-effect transistor (FET) based power amplifier (PA). For example, such an amplifier is shown to have 80% efficiency over 43% fractional bandwidth at around 255 MHz, and 60% efficiency over an octave bandwidth at around 245 MHz.

Although various examples are described in the context of GaN FET PAs, it will be understood that one or more features of the present disclosure can also be implemented for other types of PAs. For example, one or more features of the present disclosure can also be implemented with other types of transistors, including bipolar-junction transistor (BJT) based PAs. In another example, one or more features of the present disclosure can also be implemented with other process technologies other than GaN process technology.

Figure 1:
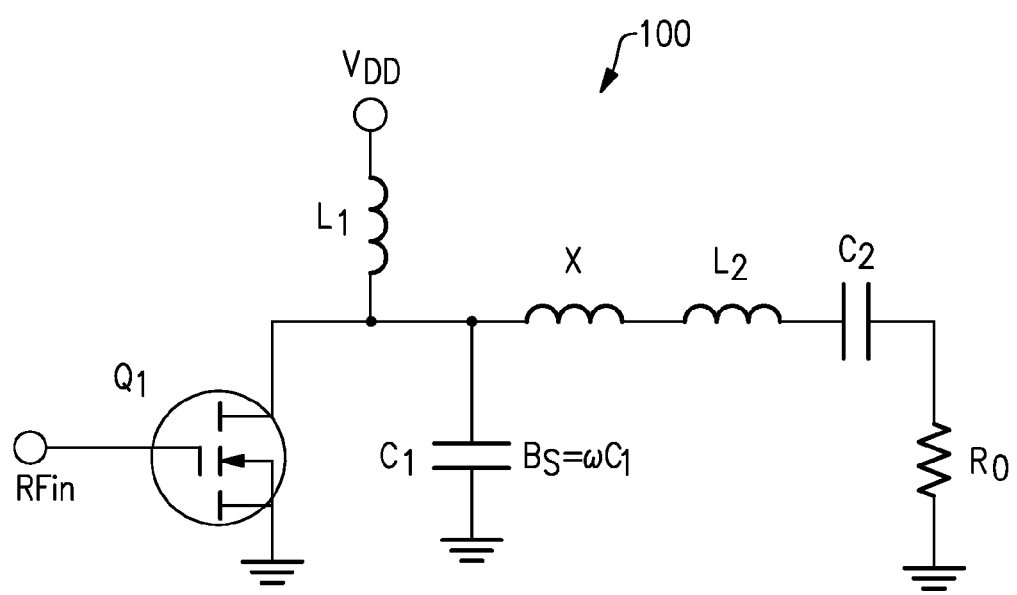
FIG. 1 shows an example of an optimum class-E amplifier.

In some RF applications, benefits of high efficiency power amplifiers (PAs) can be realized with class-E operation. An optimum true-transient class-E PA operation typically includes its operating bandwidth being inherently a narrow-band since the active device acts as a true switch at a given fundamental-frequency ($f_0$). An example of such an optimum class-E amplifier is shown in FIG. 1 as a PA configuration 100. It is noted that sub-optimal class-E operation can be implemented at frequencies other than $f_0$. However, keeping high efficiency over wide bandwidth is generally not possible without changing one or more amplifier parameters (e.g., $B_S$, X, $V_{DD}$, etc.).

Other broadband class-E PAs techniques can be implemented. For example, a conventional broadband matching including device parasitics can be utilized. Also, a balanced class-E amplifier can be implemented at the expense of using at least two amplifiers with transmission-line based matching networks. It is noted that these example techniques are in general for higher frequency operations in the range of 800 MHz and above.

An alternative approach for broadband class-E amplification can be implemented by taking advantage of a shunt reactive element and the L-C resonator frequency response to keep a constant reactance at the device drain for a wide frequency range. Such a design is often known as reactance compensation using a finite inductance DC-feed inductor.

Nevertheless, the basic reactance compensation loading network typically carries several practical issues that limit high frequency performance of the PA. Such a network typically requires, or is desirable to have, broadband impedance matching to 50-Ohms which is not generally easily achievable without introducing significant insertion loss, which in turn reduces the PA efficiency and/or limits the amplifier bandwidth.

Additionally, the series L-C resonator is typically sensitive to the parasitic straight capacitance to ground of the printed board (PWB), and in some cases, such a design can include impractical component values. In order to address the aforementioned practical issues of broadband class-E designs while maintaining high efficiency and flatter output power over a wide range of frequencies, a design technique based on lumped-element network transforms can be implemented as described herein. An example of a lumped-element loading network topology is disclosed herein, and examples of performance results of such a topology show high efficiency over wide bandwidth.

A given reactive network can include a dual network with substantially same reactance characteristics as a function of frequency. For example, a series-shunt network of capacitors (or inductors) can be represented by a shunt-series network of capacitors (or inductors), plus a transformer. Likewise, a shunt-series network of capacitors (or inductors) can be represented by a series-shunt network of capacitors (or inductors), plus a transformer. These are called L-left to L-right (as shown in an example configuration 102 of FIG. 2A) and L-right to L-left (as shown in an example configuration 104 of FIG. 2B) transforms, respectively, with arbitrary transformer turn ratios, N. FIG. 2C shows an example configuration 106 where a transform involves moving a transformer between left and right sides of a shunt capacitor (or inductor). These types of network transforms are utilized in many filter designs.

Other network transforms can be utilized to change a given network topology with an equivalent network at some or all frequencies.

The number of transforms and type of transform used in a given network design can depend upon a desired final topology that satisfies a given design. The first applied transforms can be vital in determining such a final topology. Therefore, being aware of which transforms are available for a given component or components and knowing where to apply them is desirable before starting to transform a circuit. As described herein, a design example can include network transforms such as one or more of the examples of FIGS. 2A-2C.

In order to demonstrate the use of network transforms, one can begin a design with a reactance compensation loading network using the equations given in, for example, N. Kumar, et. al., "High-Efficiency Broadband Parallel-Circuit Class E RF Power Amplifier with Reactance-Compensation Technique," IEEE Transactions on Microwave Theory and Techniques, Vol. 56, No. 3, March 2008, which is hereby expressly incorporated by reference herein in its entirety.

Design parameters of the loading network can be computed based on the example Polyfet GP2001 GaN FET device with a low parasitic drain-to-source capacitance of, for example, $C_{DS}$=4 pF. Using equations from the above-referenced Kumar paper, a target output power is 18.0 W, with a supply voltage $V_{DD}$=18.2 V. As shown in an example configuration 108 of FIG. 3, a desired load impedance is $R_0$=25-Ω. Various component values computed at an example frequency of 200 MHz are as follows: $C_1$=17.8 pF (a total of 21.8 pF minus $C_{DS}$) and $L_1$=14.56 nH. For broadband operation, the series resonator $L_2$=20.4 nH and $C_2$=31.02 pF.

It is noted that $L_1$ can function as a finite-inductance choke. It is also noted that the PA load impedance is 25-Ω, hence requiring matching as shown in FIG. 3.

Figure 3:
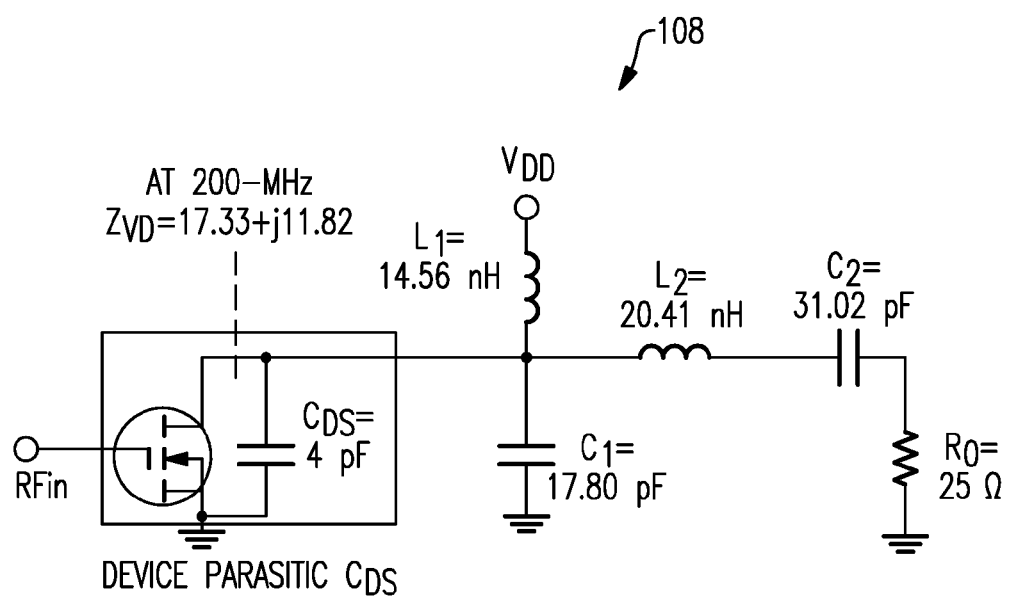
FIG. 3 shows an example broadband class-E power amplifier configuration having a load impedance of 25 Ohms.

In the example of FIG. 3, the example impedance at device drain is $Z_{VD}$=17.3+j11.8Ω. Network transforms can then be applied to this basic network. The first transform can be selected to provide impedance matching from 25 up to 30-Ohms where the impedance transformation ratio is relatively low at 1.2 (Q=0.4), thereby maintaining broadband performance. For such a purpose, a typical L-C matching network can be utilized as shown in an example configuration 110 of FIG. 4A.

Figure 4A:
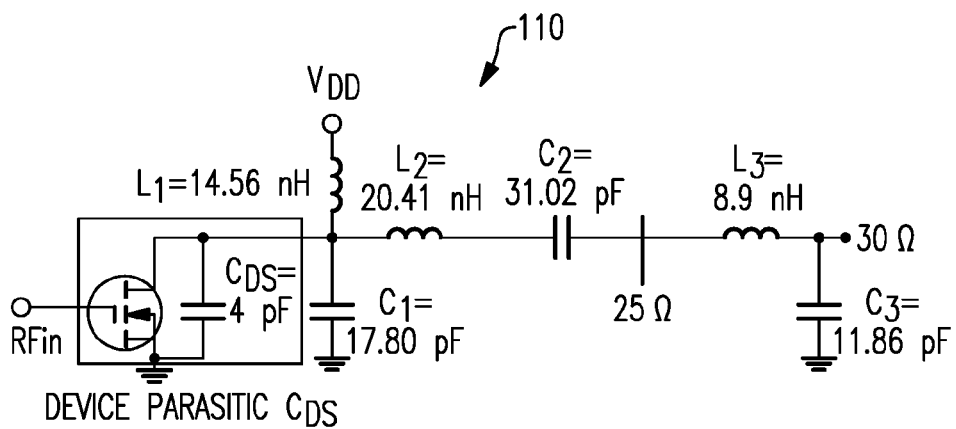
FIG. 4A shows an example having a network transform applied to the example of FIG. 3, in which an L-C matching network is utilized to provide an increased impedance matching to 30 Ohms, such that impedance transformation ratio is relatively low to maintain broadband performance.
Figure 4B:
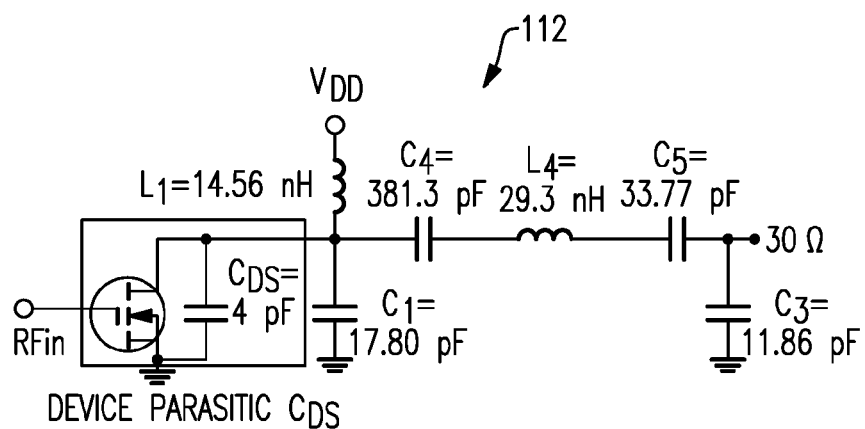
FIG. 4B shows an example having a network transform applied to the example of FIG. 4A, in which inductances along the signal path can be merged into a single inductance, and a capacitance along the signal path can be split into two capacitances.

In the next transform, the inductors $L_2$ and $L_3$ from FIG. 4A can merge to form inductor $L_4$, and the result of such a transform is shown as an example configuration 112 of FIG. 4B. Also, capacitor $C_2$ from FIG. 4A can split into capacitors $C_4$ and $C_5$. It is noted that values of capacitors $C_4$ and $C_5$ can be computed taking into account the next two example transforms.

Figure 2A:
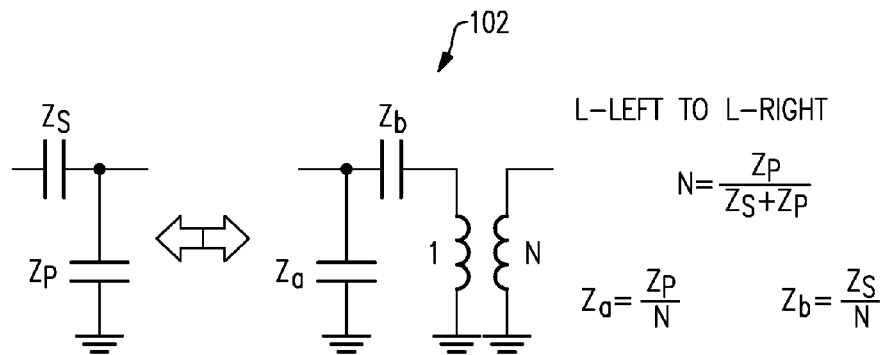
FIG. 2A shows an example of an L-left to L-right transformation.
Figure 2B:
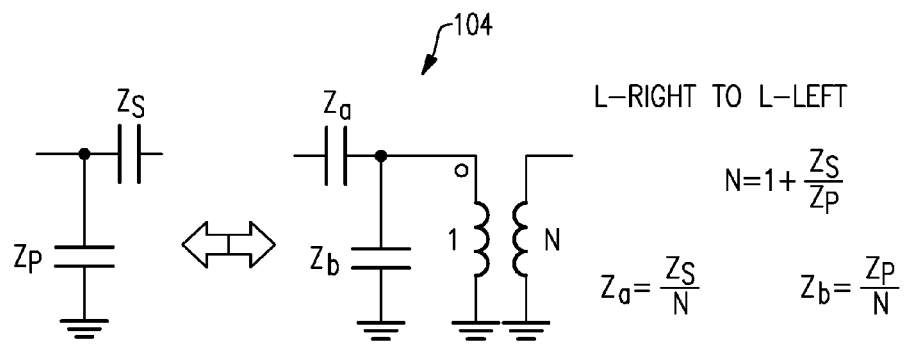
FIG. 2B shows an example of an L-right to L-left transformation.
Figure 2C:
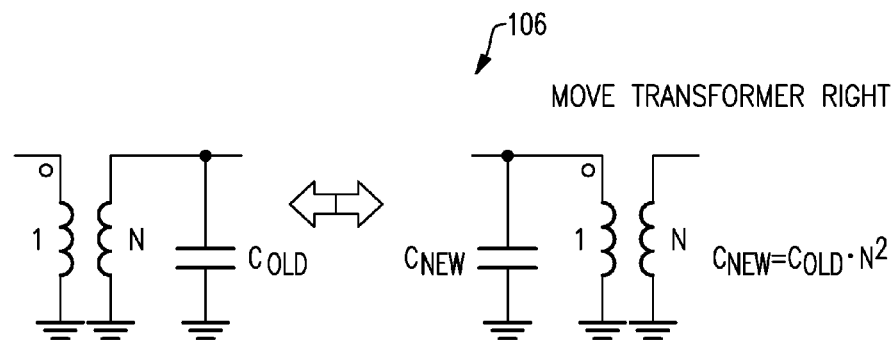
FIG. 2C shows an example of a transform involving moving a transformer between left and right sides of a shunt capacitor.
Figure 4C:
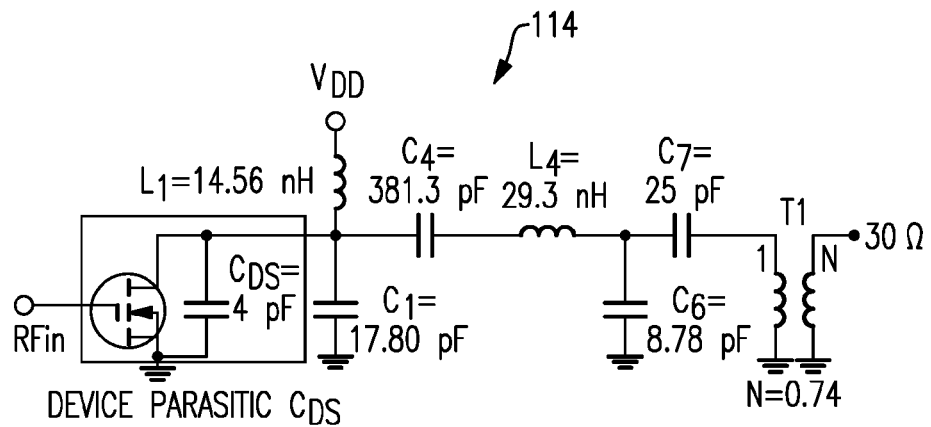
FIG. 4C shows an example having a network transform applied to the example of FIG. 4B, in which the L-left to L-right transform of FIG. 2A is applied.

Since capacitors $C_5$ and $C_3$ form an inverted L-shaped network, and referring to the examples of FIGS. 2A-2C, the applied transform can be an "L-left to L-right" (FIG. 2A) with an example transformer T1 turns ratio of 0.74. FIG. 4C shows an example configuration 114 resulting from such a transform.

Figure 4D:
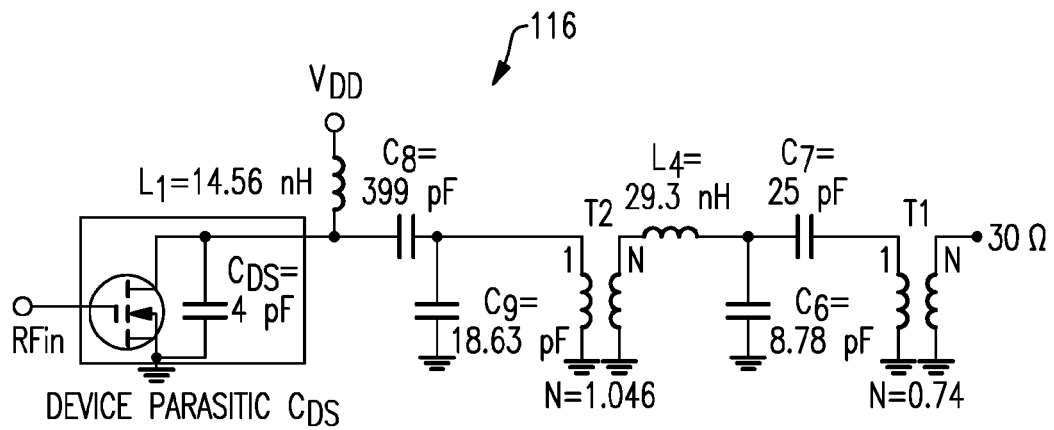
FIG. 4D shows an example having a network transform applied to the example of FIG. 4C, in which the L-right to L-left transform of FIG. 2B is applied.

Likewise, $C_4$ and $C_1$ can be transformed using the "L-right to L-left" transform from the example of FIG. 2B, with an example transformer T2 turns ratio of 1.046. FIG. 4D shows an example configuration 116 resulting from such a transform.

Figure 5A:
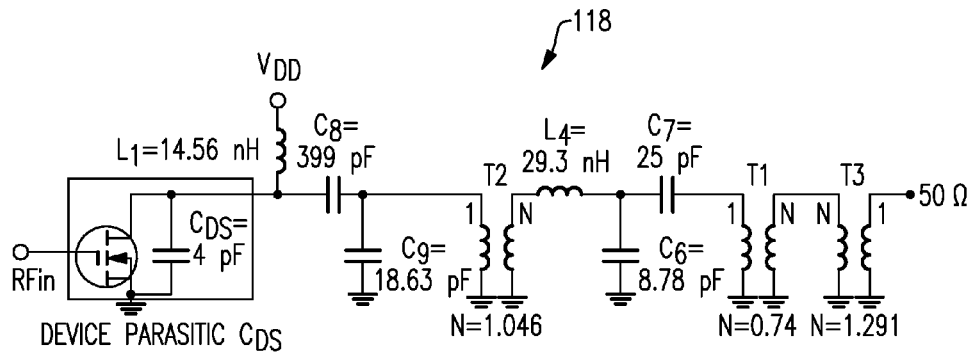
FIG. 5A shows an example having a network transform applied to the example of FIG. 4D, to provide a further increase in impedance matching to 50 Ohms.
Figure 5B:
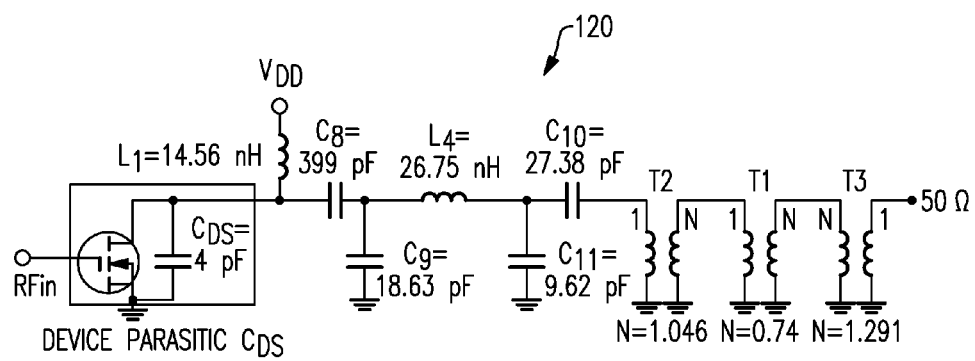
FIG. 5B shows an example having a network transform applied to the example of FIG. 5A, in which the transformer-moving transform of FIG. 2C is applied to move one or more transformer such that a plurality of transformers resulting from the various transforms are grouped together.

It is noted that the transformation ratio values of T1 and T2 can be chosen specifically so that they will substantially vanish or be reduced with a third transformer T3 in an example final step as described herein in reference to FIG. 5B. Therefore, the example transform sequence from FIGS. 4A-4D can be summarized as listed in Table 1.

TABLE 1

| Step | Transform |
|---|---|
| 1 | Increase the load impedance from 25 to 30 Ω (e.g., FIG. 4A). |
| 2 | Split capacitor $C_2$ into $C_4$ and $C_5$ (e.g., FIG. 4B). |
| 3 | Apply L-left to L-right to capacitors $C_5$ and $C_3$, and create $C_7$, $C_6$ and T1. Merge inductor $L_2$ and $L_3$ into $L_4$ (e.g., FIG. 4C). |
| 4 | Apply L-right to L-left to capacitors $C_4$ and $C_1$, and create $C_8$, $C_9$ and T2 (e.g., FIG. 4D). |

The foregoing transformation sequence changes the network topology so that the first element from drain to load is the series capacitor $C_8$. It is noted that the network now has components to ground at all nodes. The next two steps can be utilized to eliminate transformers T1 and T2 using the example "move transformer right" transform of FIG. 2C and match to 50-Ω using a transformer T3 with an example turn ratio of N=1.29. An example of such a transform sequence can be summarized as listed in Table 2. Example configurations corresponding to the steps of such a transform sequence are shown in FIGS. 5A and 5B as 118 and 120.

TABLE 2

| Step | Transform |
|---|---|
| 5 | Step-up the load impedance from 30 to 50-Ω by adding transformer T3 with N = 1.29 (e.g., FIG. 5A). |
| 6 | Shift the transformer T2 to the right in order to reach transformer T1 and T3 (e.g., FIG. 5B). |

Referring to Step 5 of Table 2 and FIG. 5A, it is noted that such a transform is broadband matching since an ideal transformer is used with more turns in the primary than in the secondary.

Figure 5C:
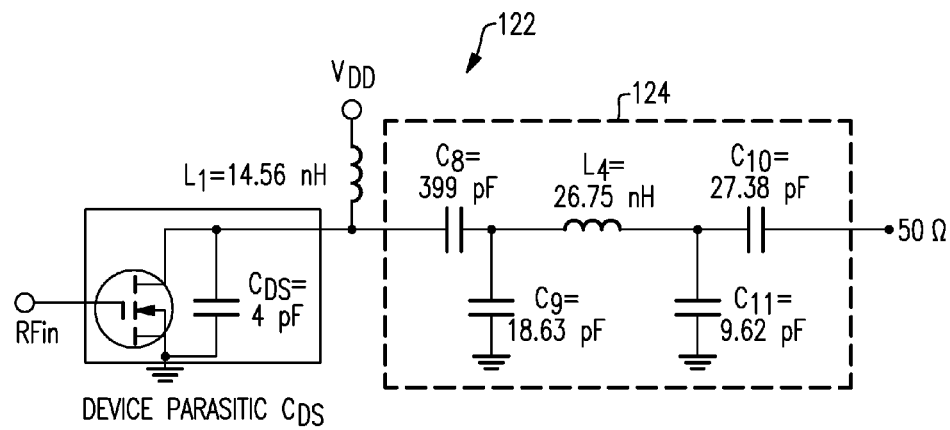
FIG. 5C shown an example configuration in which the plurality of transformers of FIG. 5B can be removed by selectively configuring the respective impedance transformation ratios.

FIG. 5C shows an example configuration 122 that can result from the foregoing sequence of transforms. In the example of FIG. 5C, it is noted that a network 124 at the output of the PA has no transformers.

It is further noted that although the network transforms of FIGS. 2A-2C are equivalent at all frequencies, the frequency response of the original network of FIG. 3 is not exactly equal to the frequency response of the final network of FIG. 5C. Such a difference can be due to the example 30 to 25-Ω impedance matching is equivalent at a given frequency.

Figure 6:
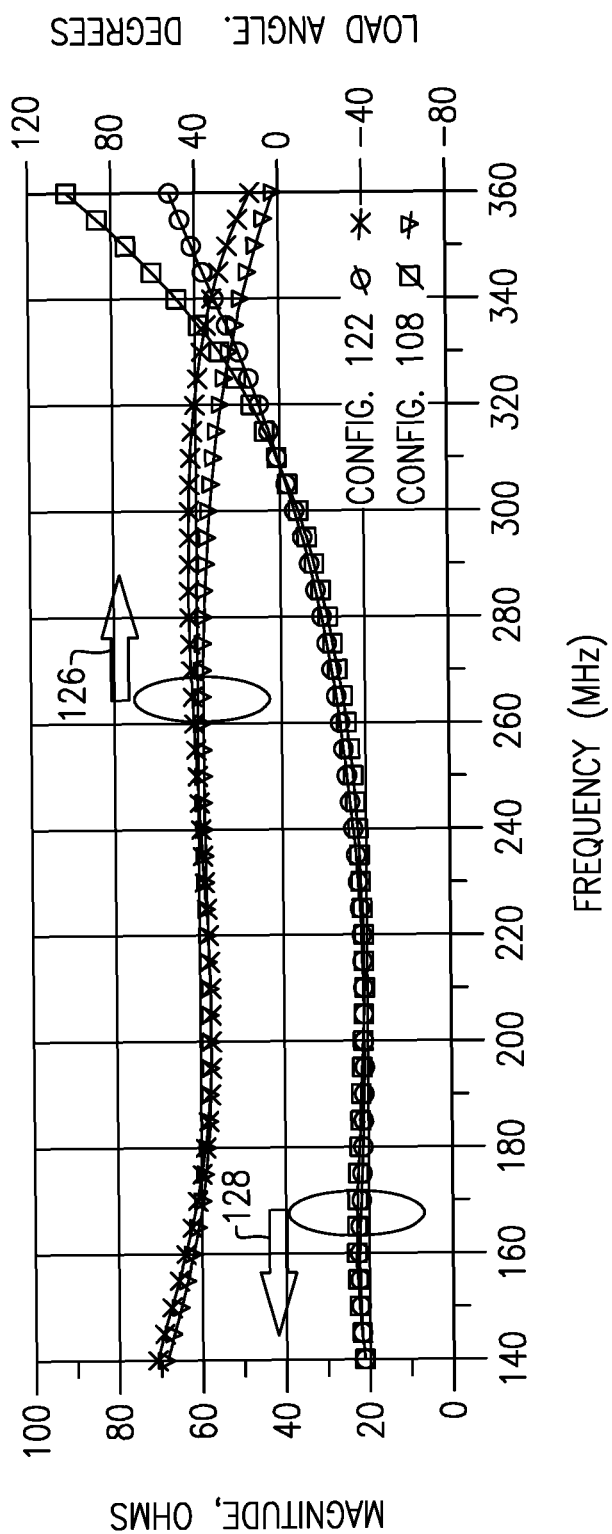
FIG. 6 shows simulated impedance magnitude and phase angle plots for the examples of FIGS. 3 and 5C.

Nonetheless, FIG. 6 shows similar simulated impedance magnitude $|Z_{VD}|$ and phase angle presented at the intrinsic drain across a frequency range for both networks (configuration 108 of FIG. 3, and configuration 122 of FIG. 5C). It is noted that the network of FIG. 5C does not include a transformer, and that all nodes have respective shunt capacitors to ground. It is also noted that the example T3 turns ratio of N=1.291 matches 30 to 50-Ω, and this value was expected when applying the previous transforms as the inverse value of the product of T1 and T2 turns ratios. Thus, the equivalent transformer turns ratio in FIG. 5B equals to unity and vanishes (e.g., 1.046×0.74×1.291=1).

It is noted that other transformation sequences can be utilized to obtain different topologies. Further, it will be understood that the transforms utilized herein (e.g., transforms of FIG. 2) are examples; and that other transforms can be utilized.

As described herein, the example network topology of FIG. 5C is found to be very convenient for implementation and tuning in a frequency range of, for example, 150 to 350 MHz. It is also noted that the same transform sequence previously described can be applied to other amplifier configurations (e.g., a true-transient class-E amplifier). In such an application, benefits of broadband operation may or may not be realized.

In some embodiments, the example configuration of FIG. 5C can be implemented utilizing various forms of capacitances and inductances. Such capacitances and inductances can be implemented as, for example, passive components, wire-based components, or some combination thereof.

In the various examples described herein in reference to FIGS. 3-5, specific example values are shown for the various capacitances and inductances. It will be understood that such specific example values are simply examples for the purpose of description by way of example sequence steps for an example operating frequency. Accordingly, it will be understood that one or more features of the present disclosure can also be implemented utilizing other values of capacitances and inductances.

In some embodiments, an input matching network can be of interest since it can provide broadband input match functionality. For example, since a 10-Ohms resistor can be added at the gate (e.g., for stability), the input impedance can be more favorable for a three section match in order to achieve broadband matching.

Figure 7:
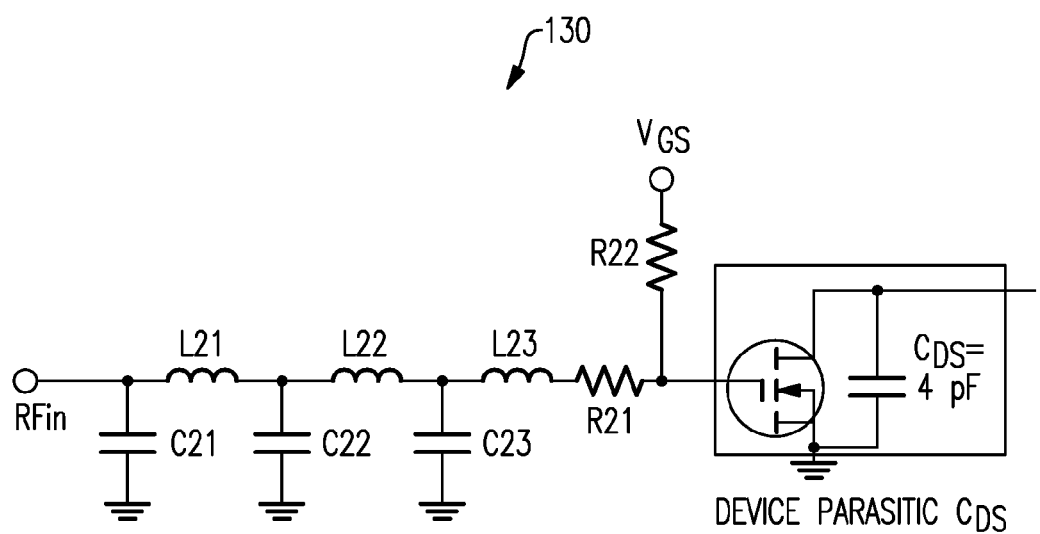
FIG. 7 shows an example where an input matching network can be implemented to facilitate broadband matching functionality.

FIG. 7 shows an example configuration 130 having such an input matching network. The three section match can be implemented by, for example, three inductances L21, L22, L23 arranged in series between an RF input node (RFin) and an input of the amplifying transistor (e.g., at the gate). A first shunt capacitance C21 can be implemented between the RF input node and ground. A second shunt capacitance C22 can be implemented between a node (between L21 and L22) and ground. A third shunt capacitance C23 can be implemented between a node (between L22 and L23) and ground.

In the example of FIG. 7, the third inductance L23 is shown to be coupled to the gate of the amplifying transistor through a resistance R21. Further, a resistance R22 is shown to be provided between a bias node $V_{GS}$ and the gate.

Figure 8:
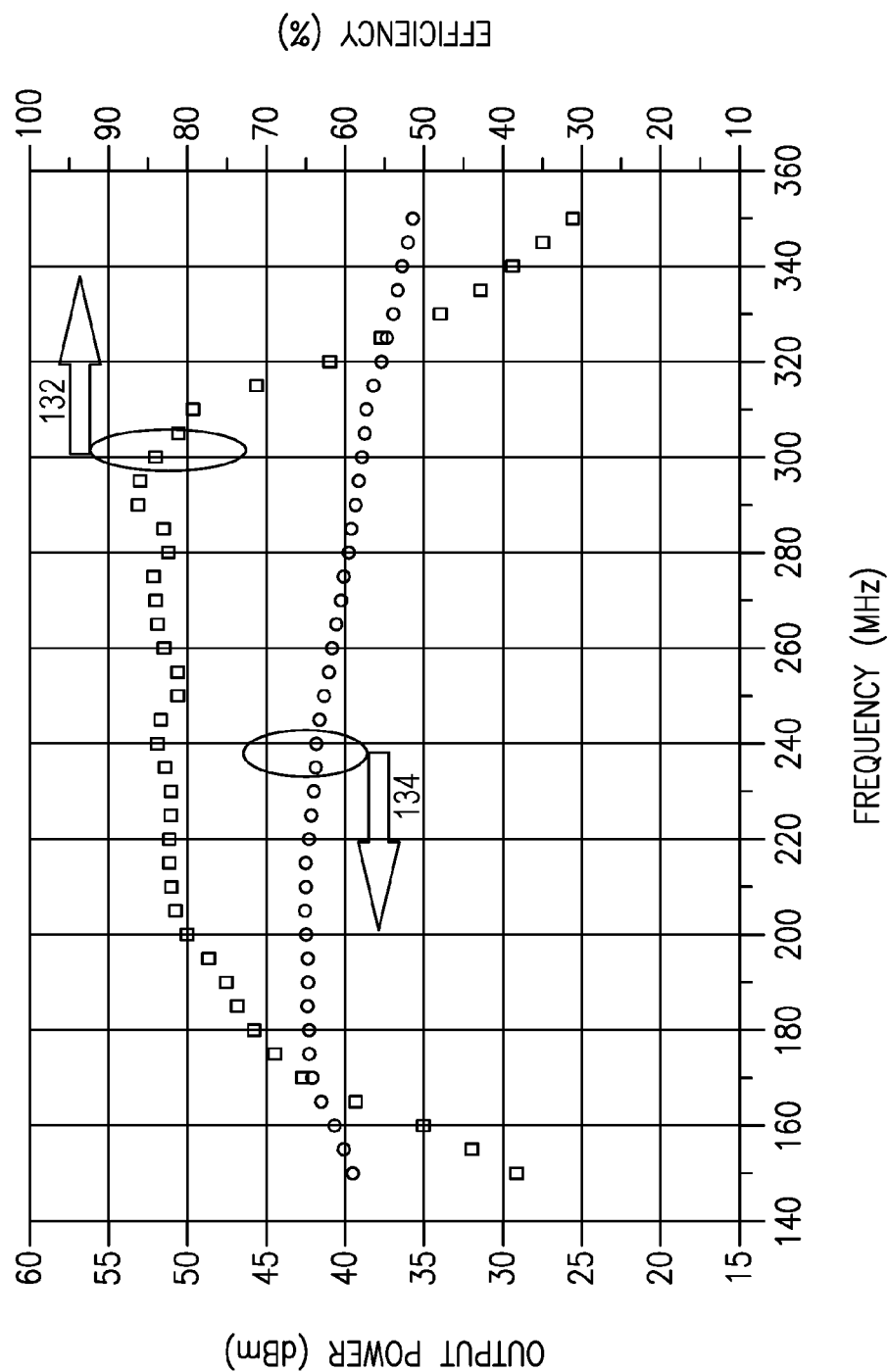
FIG. 8 shows performance examples for the amplifier configuration of FIG. 5C.

FIG. 8 shows examples of performance for the amplifier configuration 122 of FIG. 5C, in a frequency range of 150 to 350 MHz in 5 MHz steps for a fixed input power of 28 dBm. The arrow 132 indicates that the corresponding curve is for measured efficiency of the amplifier configuration, and the arrow 134 indicates that the corresponding curve is for measured output power of the amplifier.

Referring to FIG. 8, it is noted that a 60% efficiency bandwidth is an octave with an output power variation within 4 dB (42.54 to 37.55 dBm). An 80% efficiency bandwidth is about 110 MHz (43% fractional bandwidth) with an output power variation of about 3.82 dB (42.54 to 38.71 dBm).

It is further noted that the efficiency at the designed frequency of 200 MHz is approximately 79.8% with a measured output power of 42.5 dBm (17.8 W). Accordingly, the gain is approximately 14.5 dB. It is further noted that the broadband performance is kept beyond the design frequency and high efficiency is maintained for a few MHz below the design frequency. It is further noted that the highest efficiency in the example of FIG. 8 is approximately 85.8% achieved at 290 MHz.

As described herein, network transform technique can be utilized to design PA loading networks as well as broadband matching circuits. Choosing an appropriate transform sequence can also be important for a given topology so that broadband efficiency and output power can be achieved for a class-E amplifier with a more suitable network for practical implementation.

Various examples are described herein in the example context of class-E amplifiers. However, it will be understood that one or more features of the present disclosure can also be implemented for other classes of power amplifiers.

Figure 9:
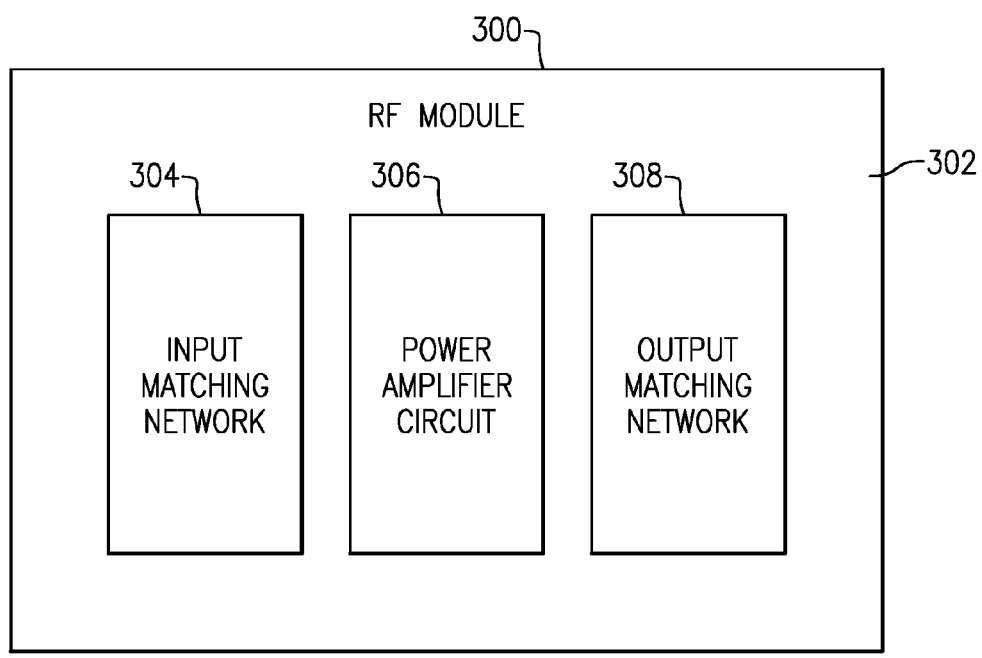
FIG. 9 shows that in some embodiments, one or more features of the present disclosure can be implemented in a packaged module.

FIG. 9 shows that in some embodiments, one or more features of the present disclosure can be implemented in an RF module 300. Such an RF module can include a packaging substrate configured to receive a plurality of components.

The RF module 300 of FIG. 9 can include a power amplifier circuit 306 and an output matching network 308 having one or more features as described herein. In some embodiments, the RF module 300 can also include an input matching network having one or more features as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
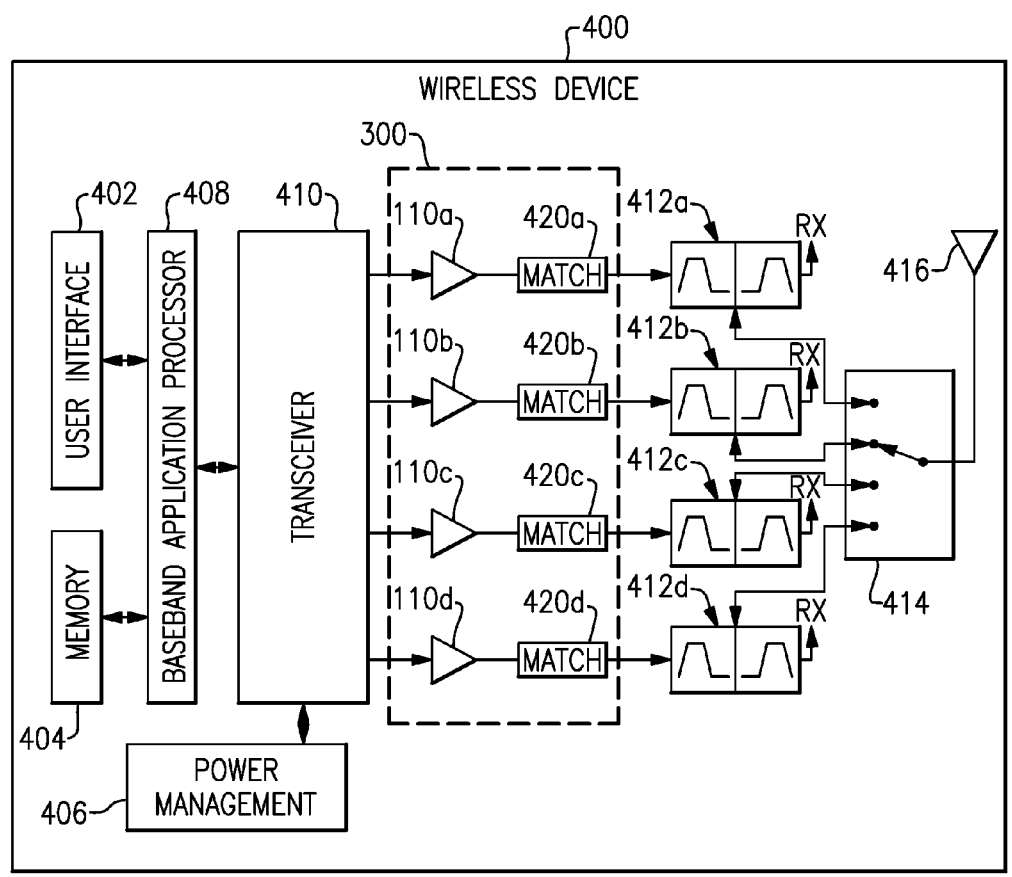
FIG. 10 shows an example of a wireless device having one or more features as described herein.

FIG. 10 depicts an example wireless device 400 having one or more advantageous features described herein. In the example, one or more PAs 110 can be part of an RF module 300 such as the example of FIG. 9. Such a module can include match circuits 420 for their respective PAs 110. Some or all of such match circuits can include one or more features as described herein.

The PAs 110 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and the PAs 110.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device 400, and/or to provide storage of information for the user.

In the example wireless device 400, outputs of the PAs 110 are shown to be matched (via the match circuits 420) and routed to an antenna 416 via their respective duplexers 412a-412d and a band-selection switch 414. The band-selection switch 414 can be configured to allow selection of an operating band. In some embodiments, each duplexer 412 can allow transmit and receive operations to be performed simultaneously using a common antenna (e.g., 416). In FIG. 10, received signals are shown to be routed to "Rx" paths that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
an amplifying transistor having an input and an output; and
a matching circuit coupled to the output of the amplifying transistor and including a first capacitance, an inductance, and a second capacitance connected in series, the matching circuit further including a third capacitance implemented in a shunt path from a node between the first capacitance and the inductance to a ground, the matching circuit further including a fourth capacitance implemented in a shunt path from a node between the inductance and the second capacitance to the ground.

2. The power amplifier of claim 1 wherein the amplifying transistor includes a gate for receiving a signal, a source coupled to the ground, and a drain as the output for providing an amplified radio-frequency signal.

3. The power amplifier of claim 1 wherein the matching circuit is configured to provide matching to a load impedance at an output of the matching circuit.

4. The power amplifier of claim 3 wherein the load impedance is approximately 50 Ohms.

5. The power amplifier of claim 4 wherein the power amplifier is configured to operate as a broadband class-E power amplifier.

6. The power amplifier of claim 5 wherein values of the first capacitance, the inductance, the second capacitance, the third capacitance, and the fourth capacitance are based on a plurality of transforms of a first matching circuit of a broadband class-E power amplifier configured to provide matching to a first load impedance that is lower than 50 Ohms.

7. The power amplifier of claim 6 wherein the first load impedance is approximately 25 Ohms.

8. The power amplifier of claim 6 wherein the plurality of transforms includes a first transform in which an L-C matching network is utilized to provide an increased impedance matching from the first load impedance to an second load impedance value that is between the first load impedance value and 50 Ohms.

9. The power amplifier of claim 8 wherein the plurality of transforms further includes a second transform in which inductances along a signal path are merged into a single inductance, and a capacitance along the signal path is split into a plurality of capacitances.

10. The power amplifier of claim 9 wherein the plurality of transforms further includes a third transform in which an L-left to L-right transform is applied.

11. The power amplifier of claim 10 wherein the plurality of transforms further includes a third transform in which an L-right to L-left transform is applied.

12. The power amplifier of claim 11 wherein the plurality of transforms further includes a fourth transform in which a transformer is utilized to provide a further increased impedance matching from the second load impedance value to 50 Ohms.

13. The power amplifier of claim 12 wherein the plurality of transforms further includes a fifth transform in which a transformer-moving transform is applied to move one or more transformer such that a plurality of transformers are grouped together.

14. The power amplifier of claim 13 wherein the plurality of transformers have an overall transform ratio of approximately 1.

15. A radio-frequency module comprising:
a packaging substrate configured to receive a plurality of components; and
a power amplifier implemented on the packaging substrate, the power amplifier including an amplifying transistor having an input and an output, the power amplifier further including a matching circuit coupled to the output of the amplifying transistor and having a first capacitance, an inductance, and a second capacitance connected in series, the matching circuit further including a third capacitance implemented in a shunt path from a node between the first capacitance and the inductance to a ground, the matching circuit further including a fourth capacitance implemented in a shunt path from a node between the inductance and the second capacitance to the ground.

16. The radio-frequency module of claim 15 wherein the radio-frequency module is a power amplifier module.

17. The radio-frequency module of claim 15 wherein at least a portion of the power amplifier is implemented on a semiconductor die.

18. The radio-frequency module of claim 17 wherein the semiconductor die is a silicon-based die or a gallium-based die.

19. A wireless device comprising:
a transceiver;
a power amplifier in communication with the transceiver and configured to amplify a radio-frequency signal, the power amplifier including an amplifying transistor having an input and an output, the power amplifier further including a matching circuit coupled to the output of the amplifying transistor and having a first capacitance, an inductance, and a second capacitance connected in series, the matching circuit further including a third capacitance implemented in a shunt path from a node between the first capacitance and the inductance to a ground, the matching circuit further including a fourth capacitance implemented in a shunt path from a node between the inductance and the second capacitance to the ground; and
an antenna in communication with the power amplifier and configured to facilitate transmission of the amplified radio-frequency signal.

20. The wireless device of claim 19 wherein the wireless device is a cellular phone.

* * * * *